United States Patent [19]

Vrijssen et al.

[11] Patent Number: 5,521,464
[45] Date of Patent: May 28, 1996

[54] RAPIDLY SCANNING CATHODE RAY TUBE/SCANNING LASER

[75] Inventors: Gerardus A. H. M. Vrijssen; Hugo J. Cornelissen; Gerard E. van Rosmalen; Cornelis J. Savert, all of Eindhoven, Netherlands

[73] Assignee: U.S. Philips Corporation, New York, N.Y.

[21] Appl. No.: 359,325

[22] Filed: Dec. 16, 1994

Related U.S. Application Data

[63] Continuation of Ser. No. 252,132, May 31, 1994, abandoned, which is a continuation of Ser. No. 869,406, Apr. 16, 1992, abandoned.

[30] Foreign Application Priority Data

| May 16, 1991 | [EP] | European Pat. Off. ............... 91107901 |
| Mar. 19, 1992 | [EP] | European Pat. Off. ............... 92200785 |

[51] Int. Cl.$^6$ .................................................. H01J 29/62
[52] U.S. Cl. ........................................... 313/450; 313/414
[58] Field of Search ..................... 313/440, 450, 313/461; 372/74; 315/382

[56] References Cited

U.S. PATENT DOCUMENTS

| 4,539,687 | 9/1985 | Gordon et al. ........................ 372/74 |
| 4,853,589 | 8/1989 | Vrijssen ............................. 313/477 R |
| 4,857,797 | 8/1989 | Vrijssen et al. ....................... 313/450 |
| 5,015,925 | 5/1991 | Spanjer et al. ...................... 313/450 X |

FOREIGN PATENT DOCUMENTS

| 0233379 | 3/1986 | European Pat. Off. . |
| 0284160 | 3/1988 | European Pat. Off. . |
| 0378269 | 1/1990 | European Pat. Off. . |
| 0442571 | 8/1991 | European Pat. Off. ......... H01J 29/62 |

OTHER PUBLICATIONS

S. Colak et al., "Electron Beam Pumped II–VI Lasers", Journal of Crystal Growth, 72 (1985), pp. 504–511.

Primary Examiner—Sandra L. O'Shea
Assistant Examiner—Vip Patel
Attorney, Agent, or Firm—Robert J. Kraus

[57] ABSTRACT

An electron-optical display device includes a cathode ray tube having a cylindrical neck of very small external diameter, such as ≦15 mm, the inner surface of the neck having thereon a helical multi-element layer electrode formed of a high ohmic resistance material, which electrode constitutes a focusing lens. In combination with a deflection system of correspondingly small diameter and operating at high scanning frequencies, this makes it possible to use a very small scanning spot of high luminance and without requiring excessive deflection energy. The device may be used as a television image projection tube or as an electron beam pumped scanning laser.

13 Claims, 6 Drawing Sheets

RAPIDLY SCANNING CATHODE RAY TUBE/SCANNING LASER

This is a continuation of application Ser. No. 08/252,132, filed on May 31, 1994 now abandoned, which is a continuation of application Ser. No. 07/869,406, filed Apr. 16, 1992 now abandoned.

BACKGROUND OF THE INVENTION

1. Field of the Invention

The invention relates to an electron-optical device comprising a cathode ray tube having a target for electrons (for example, a luminescent phosphor screen arranged at the inner side of a transparent window) with an electron gun arranged opposite the target for producing an electron beam, a focusing lens for focusing the electron beam on the target and means for causing the electron beam to scan the target.

2. Description of the Related Art

For a number of applications, particularly those in picture display devices, the cathode-ray tube still has a number of unique advantages such as a high light output, easy addressability and a wide dynamic luminance range. For display devices displaying a large and flat picture, projection systems using three (monochrome) projection tubes have come into use.

For future applications it would be desirable to have (projection) tubes which can produce sharp images with more light output. There are special electron guns with which small spots can be made, using a large beam current. The envisaged object could be realised if it were not for the fact that the phosphor cannot stand this high load (larger beam current and higher current density) and will be saturated so that the light output does not increase proportionally with the beam current.

A solution would be to increase the scanning frequency (from 16 kHz to, for example, 32 or 64 kHz). However, this presents other problems because the energy required to deflect the beam reaches such high values at high frequencies that this beam is no longer suitable for the deflection (coil) system.

SUMMARY OF THE INVENTION

It is, inter alia, an object of the invention to provide an electron beam optical device comprising a cathode-ray tube enabling a small high intensity spot to scan a target at a high frequency.

To this end an electron beam optical device comprising a cathode-ray tube of the type described in the opening paragraph is characterized in that the neck of the tube has an external diameter of at most 15 mm at the location where the scanning means are arranged and in that the focusing lens is an electrostatic focusing lens which is formed by at least a portion of a multi-element layer electrode arranged on the inner surface of the neck of the tube. More particularly the neck of the tube is a cylinder having an external diameter of at most 15 mm at the location of the scanning means.

In a cathode-ray tube having such a small neck diameter the deflection system may be correspondingly small so that the required deflection energy may also be small and the use of scanning frequencies which are higher than 16 kHz will be realisable. An essential factor is, however, that the spot quality should not deteriorate. This is ensured because the electron gun is used with a focusing lens which is constituted by a multi-element layer electrode arranged on the inner surface of the neck.

An electrode of this type may be, for example, a high-ohmic resistance layer having a helical structure. The resistance layer operates as a voltage divider so that successive turns of the structure each convey a slightly different voltage in operation. In this way a focusing lens having few aberration errors can be realised. An alternative to a helical high-ohmic resistance layer is, for example, a structure having a number of separate electrically conducting rings which are connected to a voltage divider.

The electron-optical device according to the invention for scanning a target at high frequencies may be, for example, a monochrome (projection) display tube, or a colour display tube of the beam index type, or an electron beam pumped laser.

BRIEF DESCRIPTION OF THE DRAWINGS

These and other aspects of the invention will be described in greater detail with reference to the following embodiments and the drawings in which.

DESCRIPTION OF THE PREFERRED EMBODIMENTS

Figure 1:
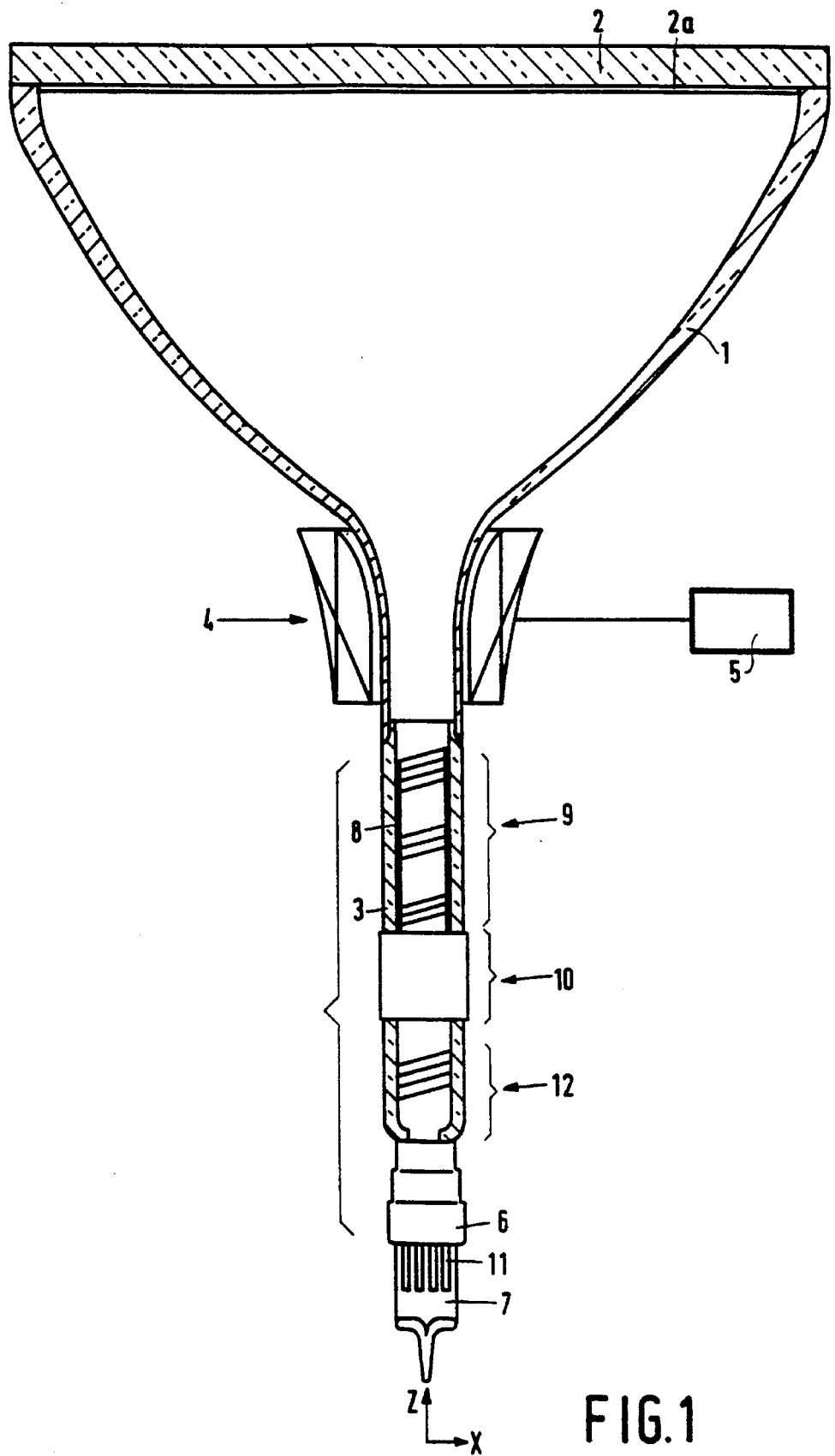
FIG. 1 shows diagrammatically a partial cross-section of a cathode-ray tube.

FIG. 1 shows a cathode-ray tube having an envelope with a funnel-shaped portion 1, a flat or (inwardly or outwardly) curved display window 2, and a target in the form of a phosphor display screen 2a arranged on the inner surface of the display window 2. The funnel-shaped portion 1 is secured to a cylindrical neck portion 3, for example, by means of a pyro-ceramic connection (enabling a portion to be secured at relatively low temperatures). The wall thickness of the funnel portion 1 decreases from a larger thickness at the display screen end thereof (for example, 5.5 mm) to a smaller thickness at the end which joins to the neck portion 3. The latter has a wall thickness which may be between 1 and 3 mm and an outer diameter which may be between 7 and 15 mm. The lower limit of 7 mm is close to the dimensions of conventional thermionic cathodes. When, for example, a p-n emitter is used, the diameter of the tube (neck) may be even smaller than 7 mm, for example 6 mm externally and 5 mm internally. Also at these small dimensions the "helical lens" to be described hereinafter is found to yield a satisfactory result. The neck portion 3 is surrounded by a deflection system in the form of a deflection unit 4 having a correspondingly small inner diameter. In comparison, the neck portion of a minineck tube has an outer diameter of 22.5 mm. (Analogously, the cathode-ray tube according to the invention could thus be referred to as a "microneck" tube). The deflection signal unit 4 is connected to a deflection generator 5. For deflection in two orthogonal directions the deflection unit 4 may comprise two coil systems. In an alternative embodiment the deflection unit 4 may have one coil system for electromagnetic deflection in a first direction, and electrodes for electrostatic deflection in a second direction, for example, the electrodes for deflection in the direction at the lower scanning frequency may be arranged within the tube. It is even possible for the tube to have only deflection electrodes which are arranged on the inner surface of the neck. The free end 6 of the neck portion 3, in which beam-shaping electrodes are arranged, terminates in a cylindrical portion 7 having a still further reduced outer diameter. A high-ohmic resistance layer 8 which forms a helical structure constitutes a focusing lens 9, and possibly a prefocusing lens 12 is also arranged on the inner wall of neck 3. Strip-shaped lead-throughs 11 enable a static focusing signal to be applied to the helical structure of the focusing lens 9. Dynamic correction signals for dynamic focusing can be externally applied in a simple manner by means of a capacitive coupling element 10 arranged on the outer wall of neck portion 3.

Figure 2:
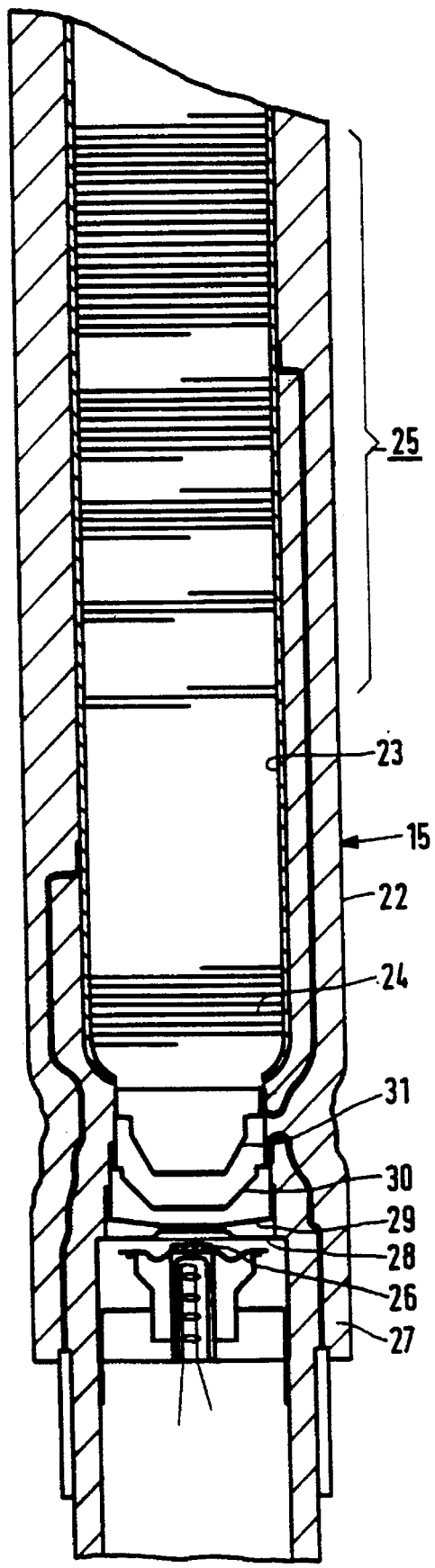
FIG. 2 shows diagrammatically a cross-section of a more detailed part of a cathode-ray tube.

FIG. 2 shows in greater detail the neck portion of a display tube according to the invention with a cathode having an emissive surface 26. In this cathode beam-shaping electrodes denoted by the reference numerals 28, 29, 30 and 31 are arranged on a stepped inner surface of the neck portion 27, while the reference numeral 23 denotes the high-ohmic resistance layer and the reference numerals 24 and 25 denote helical focusing lens portions.

As compared with the prior art, the cathode-ray tube according to the invention is an important improvement, for example, as regards the small dimensions of the neck and the deflection system, in combination with the high luminance of the electron beam. The diameter of the focusing lens (the inner diameter) may be 10 mm in the case of an external neck diameter of, for example, not more than 13 min. In a prior-art cathode-ray tube having comparable spot properties this diameter would have to be 4 cm. A deflection unit arranged around a neck having such an inner diameter would, however, be unable to work satisfactorily at scanning frequencies of more than 16 kHz.

Adjacent to the beam-shaping portion with the electrodes 28, 29, 30 and 31, the electron gun may have a prefocusing portion formed as a helix 24 in the high-ohmic resistance layer 23.

The manufacture of the electron gun may easily start from a glass tube 15 (in which the high-ohmic resistance layer 23 and the electrodes 28, 29, 30 and 31 are to be arranged), which tube is softened by heating it and is drawn on a mandril.

To obtain, for example, HDTV pictures by means of a CRT projection system, it is necessary to produce sufficient light (red, blue, green) in combination with the required resolution. The phosphor saturation (particularly of the blue phosphor) determines the light production (output) of the entire projection system. The saturation results in that a larger beam current is required than would be expected on the basis of the light efficiency of the phosphor at low beam currents. As a result, the gun must be operated at high voltages with a conventional tube structure, leading to a loss of resolution due to "blow-up" of the spot size. That is, saturation effects of the phosphor increase the apparent size of the spot.

A solution to the problem mentioned above is to increase the highest scanning frequency. A conventional value for the horizontal deflection frequency is, for example, 15.625 kHz. By increasing it to, for example, 25 kHz, or by "doubling" it to, for example 32 kHz or even "quadrupling" it to, for example, 64 kHz, the instantaneous energy applied for each pulse is decreased proportionally. Particularly with a phosphor having a short decay time such as ZnS:Ag it is possible to obtain considerably more light (an increase by a factor of 2 has been measured) when the highest scanning frequency is increased.

However, an increase of the (highest) scanning frequency means that the energy dissipation in the deflection coil system as well as the flyback voltage will increase considerably if no corrective measures are taken.

A cathode-ray tube design in accordance with the invention, which is characterized by a minimized neck diameter and a correspondingly small deflection system (which is thus located close to the electron beam) solves this problem to a considerable extent because the volume which is to be filled with magnetic energy for beam deflection is maintained as small as possible. In a conventional system of a display tube and deflection coils with a neck diameter of 22.5 mm, it is necessary to use, for example, 81.2 Ampere turns to drive the deflection system. In a display tube-deflection coil system according to the invention, with a neck diameter which is approximately half this value, only 32.5 Ampere turns are necessary. The energy dissipation is found to be lower by a factor of approximately 2.5. The use of multiple wire (stranded wire) for the deflection coils may contribute to an even further reduced heat dissipation. The significance of applicants' design is that, despite the small neck diameter, a good spot quality is maintained by using a special focusing lens. This focusing lens is essentially a multi-element layer electrode. An embodiment of this electrode is a high-ohmic resistance layer having a helical structure which is arranged on the inner surface of the neck. In the embodiment shown in FIG. 2 the high-ohmic resistance layer 23 of the focusing lens is arranged on the inner surface of one end of the glass tube 15 and the sheet-material electrodes 28, 29, 30 and 31 of the beam-shaping part are successively arranged against the inner surface of the other end of the glass tube 15 at locations having a successively stepped reduced diameter.

These stepped-diameter locations are obtained with great reproducibility and accuracy by drawing a tube section on a mandril which changes diameter in the longitudinal direction several times. A glass tube 15 as shown in FIG. 2 is obtained, for example, by drawing on a mandril which has two parts, which parts are removed from the glass tube in the opposite direction after drawing.

The electrodes 28, 29, 30 and 31 can be mounted very accurately because abutment faces for the electrodes are formed in the glass tube during the drawing operation.

Short, drawn thin-walled bushes with bottoms having central apertures for passing the electron beam are preferably used as electrodes.

Such bushes can be made easily and accurately so that the mutual distance between the bottoms and the concentricity of the apertures is also accurately determined (approximately 5 μm) after mounting. Moreover, such bushes can easily be adapted to the tube surface in the case of heat treatments at lower temperatures.

Helical focusing lenses 24 and 25 having a good quality and a high breakdown voltage are obtained by providing a layer comprising a stable, viscous binder-free suspension of ruthenium oxide particles and glass particles (glass enamel powder) in isopropanol on the inner wall of the glass tube 15. After sedimentation and drying a 5–10 μm thick powder layer adhering to the glass is the result. A high-ohmic resistance glass layer 23 containing ruthenium oxide and having a thickness of several microns is formed therefrom by means of a heat treatment in which the glass powder melts. Prior to heating, helices 28 and 29 are provided in the layer.

The helix has a pitch of, for example, 350 μm and the interruption in the resistance layer is 50 μm. After a firing treatment these interruptions have a very good voltage stability (breakdown voltage 20 kV/mm).

The layer is heated at 500° C. for approximately 20 minutes and thereby acquires a resistance of $10^7$ Ohms per square. Dependent on the quantity of ruthenium oxide, the temperature and the duration of the heating step, the resistance per square may be between $10^4$ and $10^8$ Ohm. The total resistance of the helix obtained may be, for example 10 GOhm, which means that a current of approximately 3 μA will flow through the helix when a voltage of 30 kV is applied. The high-ohmic, electrically conducting glass layer of the helix obtained can withstand further tube-processing steps up to 400° C.

The high-ohmic resistance layer 23 and the electrodes 28, 29, 30 and 31 can be contacted in different manners. Electrical connections may be made, for example by providing narrow, axially extending metal strips in the tube wall. One end of the strips then projects (radially) through an aperture in the inner wall so as to make contact in situ with the electrodes. The other end projects (axially) outwards at the flat end of the tube structure. This is described in EP-A 284160 corresponding to U.S. Pat. No. 4,853,589, issued Aug. 1, 1989, assigned to the present assignee. Such U.S. patent which is herein incorporated by reference.

In the part of the resistance layer which is not used for the focusing lens a four-pole element may be formed so as to give the electron beam an elongate shape by way of an electrostatic field. For certain uses it may be advantageous to scan with an elongate spot. An alternative is to give the apertures in one or more electrodes of the beam-shaping part a suitable (non-round) shape for this purpose or to provide the gun with a magnetic four-pole element. Combined or not combined with a four-pole element structure, a multi-pole element structure may be formed in said part of the resistance layer so as to provide a deflection facility.

It may be necessary to correct occurring picture errors (particularly curvature of the field) by means of dynamic focusing. The strength of the electron lens for focusing the electron beam is adjusted as a function of the extent of the deflection to which the electron beam is subjected at that moment. Consequently it is possible to cause the main picture plane which is then formed to intersect the display screen at the area where the electron beam impinges on the display screen. This way of correction necessitates the incorporation of an additional circuit in the control device for generating the correct dynamic focusing voltages on the electrodes of the focusing lens.

Figure 3:
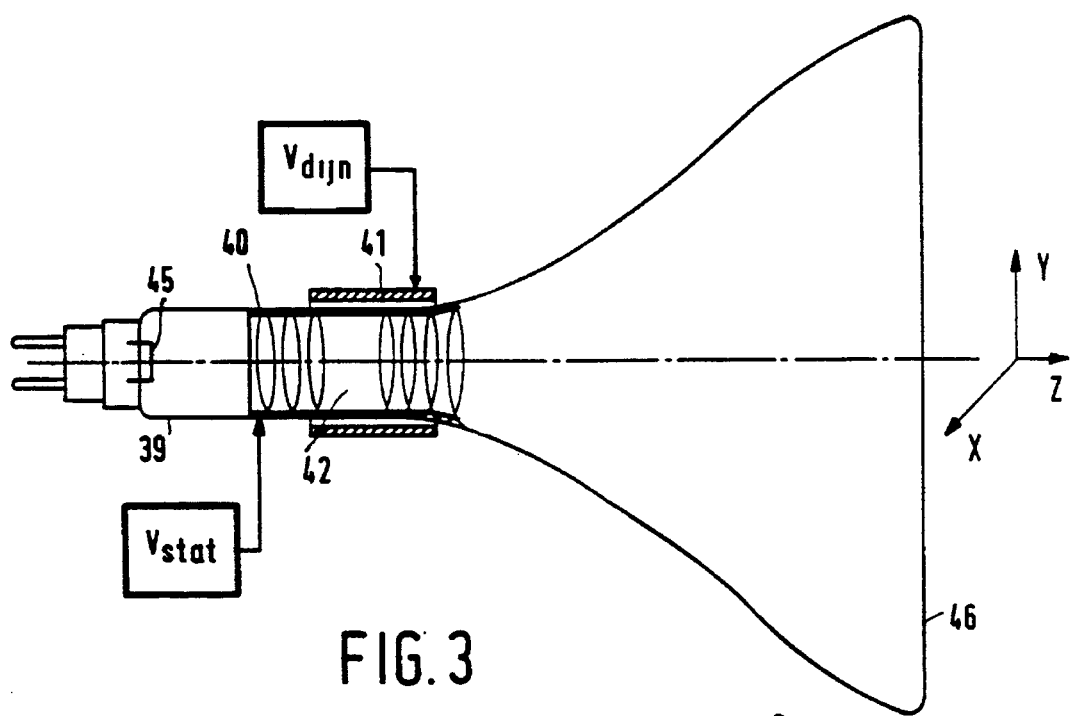
FIG. 3 is a diagrammatic cross-section of an embodiment of a cathode-ray tube having dynamic focus correction.
Figure 4:
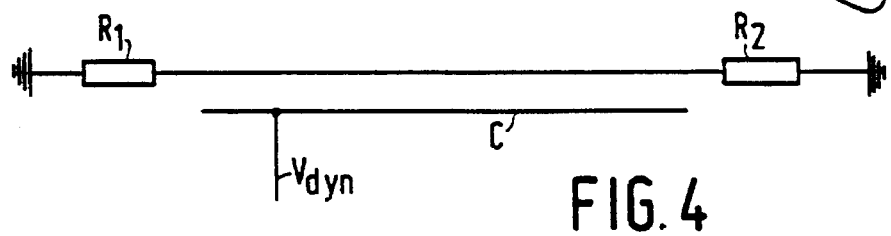
FIG. 4 shows an electrical analogon of the dynamic focus correction of the cathode-ray tube of FIG. 3.

Since the material of the helical resistance track has such a high electrical resistance (for example 10 GOhm), there is a long RC time (for example 10 msec). Consequently, the effect of a dynamic focusing voltage applied to the entrance side of the track is hardly felt in the helical resistance structure. The invention provides a solution in this respect in that a capacitive electrode denoted by 10 (FIG. 1), 41 (FIG. 3) and 49 (FIG. 5) is used which is separated by an isolator and surrounds the high-ohmic focusing lens structure. The principle of this solution will be elucidated with reference to FIGS. 3, 4 and 5.

The high-ohmic resistance layer 40 (FIG. 3) on the inner surface of the tubular structure 39 has parts with a helical pattern 42 and parts without such a pattern, all this in such a way that an optimum static focusing field, particularly with respect to minimal spherical aberration, is obtained when a voltage is applied. The dynamic focusing signal is applied to a (tubular) electrode 41 made of satisfactorily conducting electric material. The part of the inner wall of the tubular structure 40 located opposite the electrode 41 will tend to follow potential changes of the electrode 41. The inner wall and the electrode 41 may be considered as a capacitor one terminal of which is connected to the supply lead for the focusing signal and the other terminal of which is connected to the exterior via helical resistors ($R_1$ and $R_2$). Together with these resistors, the capacitor constitutes an RC network. Changes of the focusing voltage $V_{dyn}$ which are (much) faster than the corresponding RC time will not be smoothed out and will be coupled in via the capacitor. The electrical analog is diagrammatically shown in FIG. 4. In this analog the capacitor plate C coupled to the supply voltage $V_{dyn}$ represents the electrode 41 shown in FIG. 3 and the resistors $R_1$ and $R_2$ represent the helical parts of the resistance layer at the side of the cathode 45 and at the side of the screen 46, respectively.

Figure 5:
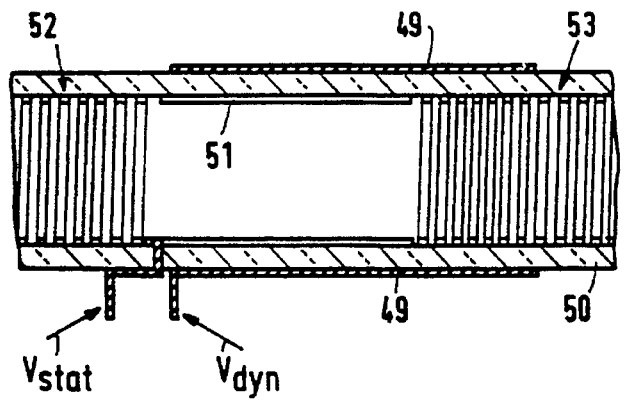
FIG. 5 is an enlarged representation of a part of FIG. 3.

A practical example will be elucidated with reference to FIG. 5. In a specific case a tubular metal electrode 49 having a length of 45 mm and a diameter of 11 mm is present on the outer surface of a glass tube 30 having a wall thickness of 0.6 mm. A high-ohmic resistance layer 51 having a helical structure 52 constituting a prefocusing lens and a helical structure 53 constituting a (main) focusing lens is provided on the inner surface. The capacitive electrode 49 bridges the space between the structures 52 and 53 and overlays at least a part of the structure 53. The capacitor constituted by the inner wall and the electrode 49 has a capacitance of approximately 5 pF in this case and the helical structures 52, 53 have a total resistance of approximately $0.5 \times 10^{10}$ Ohm with a resultant RC time of approximately 240 msec. This means that the inner wall of the tube will follow all voltage variations of the electrode 49 whose characteristic time is shorter than 100 msec. In the situation shown the static focusing voltage $V_{stat}$ and the dynamic focusing voltage $V_{dyn}$ are applied separately.

Electrode 49 may be formed, for example, by vapour-depositing a layer of material having a satisfactory electrical conductance on the outer surface of a tubular structure 50 as is shown in FIG. 5, or by providing a metal cylinder around such a tubular structure 50.

If a magnetically conducting material (for example nickel-iron) is used as a material for the cylinder in the latter case, the cylinder may also serve as a magnetic shield.

Figure 6:
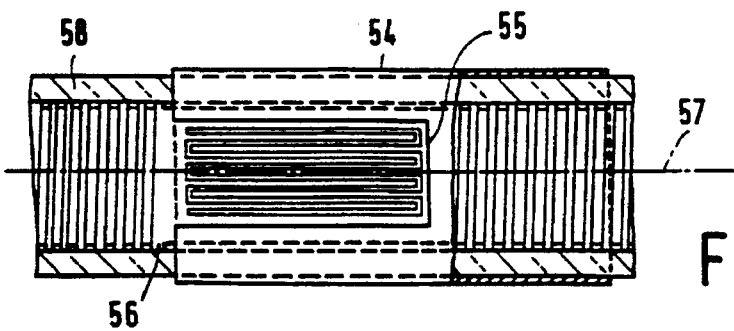
FIG. 6 shows a cross-section of a part of a cathode-ray tube with an alternative dynamic focus correction facility.

The invention is not limited to rotationally symmetrical dynamic focus correction. Interesting possibilities are provided if the capacitive electrode has a non-rotationally symmetrical configuration, for example, by providing a cylinder with apertures, slits at one end, oblique slits and the like. These elements can be used for generating dynamic multipolar fields in the static focusing area. In this way, for example, dynamic dipoles (for beam displacement) and dynamic four-poles (for astigmatic corrections) can be added. The internal high-ohmic resistance structure is preferably adapted to the correction elements in the external capacitive electrode by means of a meandering or strip-shaped pattern which is to ensure that the conducting capacity of those locations in the resistance layer where the non-rotationally symmetrical corrections are provided is minimal in the rotationally symmetrical direction. These corrections will preferably be provided in the non-helical part of the high-ohmic resistance layer, as is shown in FIG. 1. An embodiment of an astigmatic correction element is shown in FIG. 6. In this case the capacitive correction electrode 54 has recesses 55 for forming a non-rotationally symmetrical element. The part of the resistance layer 56 located under these recesses is formed as a meandering pattern whose long direction is parallel to the tube axis 57 of the (glass) cylinder 58. In this connection reference is made to EP 91200279.7 (PHN 13.238) which corresponds to allowed U.S. application Ser. No. 07/883,819 of Van Engelshoven et al, one of the named inventors being a named inventor hereof. Such application is assigned to the present assignee, and is herein incorporated by reference.

Instead of a ruthenium comprising composition, the high-ohmic resistance layer may comprise, for example, manganese oxide, nickel oxide, thallium oxide and the like.

The electron source used in the gun may be a conventional thermionic source such as an indirectly heated oxide cathode or a dispenser cathode.

The use of a pn emitter as an electron source may yield considerable advantages within the scope of the invention. For example, a pn emitter having a surface of 1 $\mu m^2$ may supply a current of 10 $\mu A$ (=1000 A/cm$^2$). This means that, for example, a current of 3 mA can be produced by a "rectangular" pn emitter of 1 $\mu m$ wide and 300 $\mu m$ long, or by a "round" pn emitter having a radius of 50 $\mu m$. Due to such a favourable current distribution, the equivalent current density of such an electron source corresponds to that in a conventional thermionic cathode which would work at a current density which is more than twice as high.

A number of specific constructions in relation to their advantages when used in an electron-optical device comprising a cathode-ray tube with a target having a luminescent phosphor screen has been described in the foregoing. However, said specific constructions may also be particularly advantageous in the case where the target comprises a laser crystal. This construction is referred to as an electron beam pumped "scannable" laser or scanning laser crt. In this case a compact construction, high scanning frequency, the possibility of electrostatic spot shaping, (for example an electrostatic four-pole for providing an elongate spot) electrostatic focusing and, if desired, electrostatic deflection in one direction or in two orthogonal directions may be of great importance.

Figure 7:
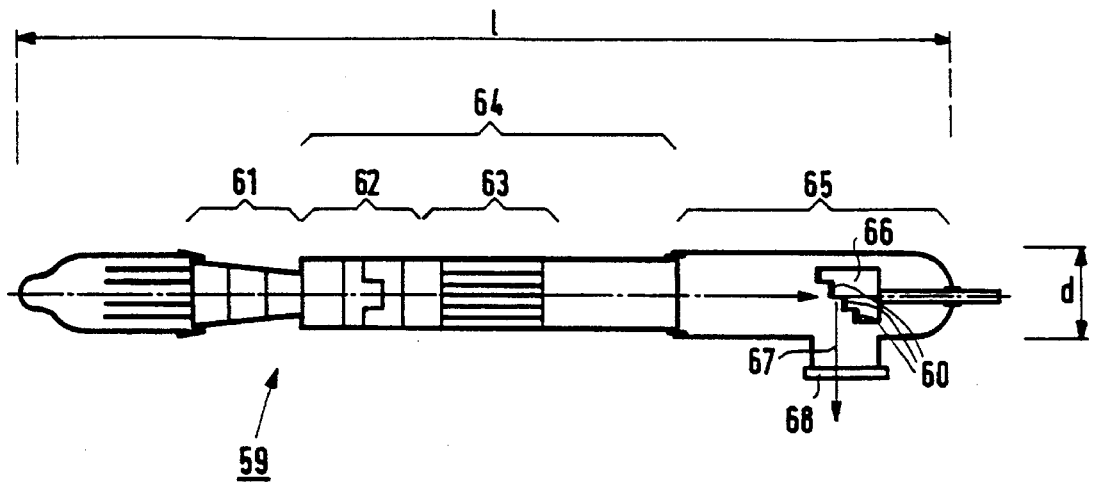
FIG. 7 and FIG. 8 are longitudinal sections of an electron beam pumped laser.

FIG. 7 is a diagrammatic longitudinal section of such an electron beam pumped laser.

Five portions can be distinguished:

A beam-producing portion 61. This portion comprises a cathode for generating electrons and a (triode) part for drawing the generated electrons into the tube 59.

A portion 62 in which an electrostatic four-pole is produced to give the electron beam an elongate cross-section, which is favourable for efficiently pumping transversally pumped lasers. (This is generally unnecessary for longitudinally pumped lasers).

A deflection portion 63. An electrostatic deflection field for scanning the target in one direction or in two orthogonal directions can be obtained by means of an electrostatic multipole to which deflection signals are applied. The deflection signals are applied by DC or capacitive connection. This section may alternatively comprise means for giving the electron beam an elongate cross-section. The four-pole in portion 62 can then be dispensed with.

A (cylindrical) focusing portion 64 of the type described above (including a multi-element layer electrode of a high-ohmic material, for example, a helical structure of a high-ohmic material provided on the inner surface of (cylindrical) envelope part 59. For a compact realisation the outer diameter may be ≦15 mm, as in the configuration described hereinbefore).

Figure 8:
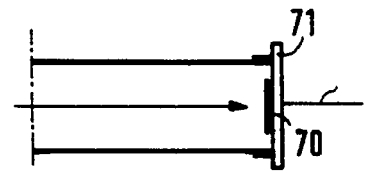

A target portion 65. This portion comprises in this case a stepped laser crystal holder 66. In the embodiment of FIG. 7, (the invention is not limited to this embodiment) the holder 66 carries a laser crystal 60 on each of its steps, which crystals have been obtained, for example, by cleaving a larger crystal. These crystals may produce laser beams of the same wavelength. An interesting alternative is to use crystals producing laser beams at different wavelengths (for example, red/green/blue). The construction of FIG. 7 is suitable for the transversal mode in which a generated laser beam 67 leaves the tube 59 through a transparent side window 68. In a construction which is suitable for the longitudinal mode a laser beam 69 generated by e-beam pumping of a laser crystal 70 leaves the tube through a transparent front window 71 (of, for example, sapphire). See FIG. 8.

Figure 9:
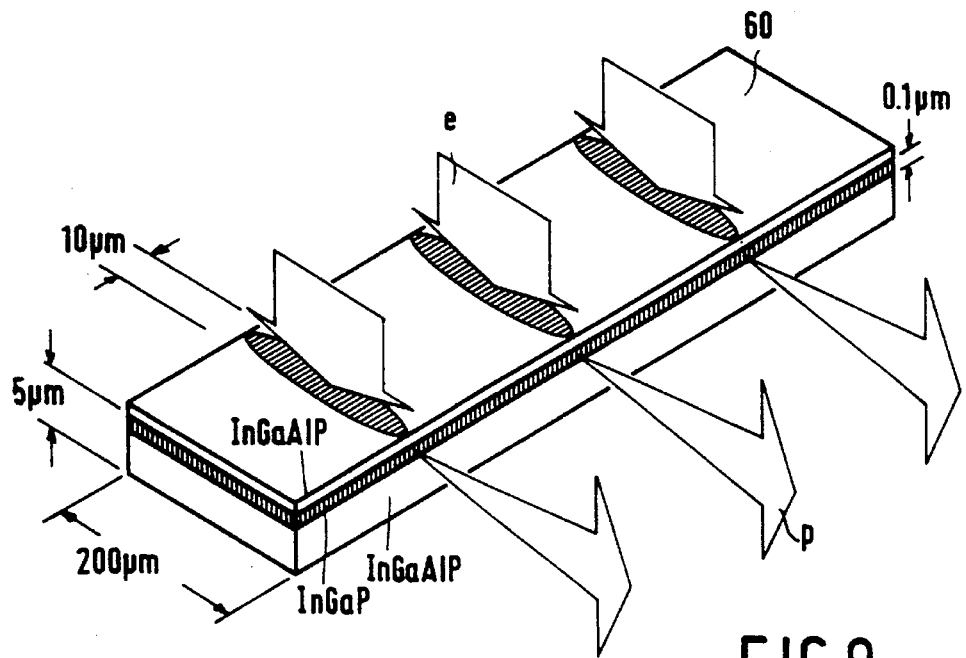
FIG. 9 shows the scanning of a laser crystal.

FIG. 9 shows one rod-shaped laser crystal 60, for example, an epitaxially grown double heterostructure of InGaP/InGaAlP with a height of 10 mm and a width of 200 $\mu m$. By scanning with an electron beam e having a narrow, elongate cross-section it is possible to excite, for example, 1000 pixels consecutively so that 1000 laser beams p are produced consecutively. The electron beam e can be moved very rapidly across the surface of the crystal 60, for example, at a bit rate in the MHz range. Bit rates above 20 Mbit/sec, for example even 100 Mbit/sec are feasible. The target may comprise a plurality of such laser crystals which are simultaneously scanned by the electron beam.

Suitable laser crystals are, inter alia, III–V double heterostructures or II–VI semiconductor laser structures. For the principle see: S. Colak, B. J. Fitzpatrick, R. N. Bhargava, J. Crystal Growth 72 (1985), page 504.

Applications which particularly benefit from the higher scanning frequencies made possible by the invention are, inter alia:

optical writing and reading (particularly on tape), quasi-parallel reading/writing on optical discs, laser display with improved resolution.

If an elongate spot of the electron beam is required on the target, the focusing lens (for example, the focusing lens 9 of the cathode-ray tube shown in FIG. 1) is provided with a non-rotationally symmetrical lens element (four-pole element). Embodiments of suitable - electrostatic - four-pole elements are described in EP-A-442 571.

Figure 10:
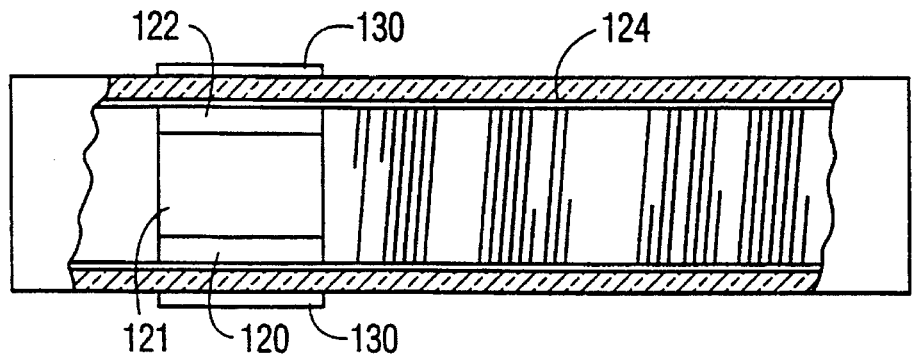
FIGS. 10, 11a and 11b, 12a and 12b show cross-sections through cathode-ray tube necks accommodating different embodiments of a structure generating a four-pole field.

FIG. 10 shows diagrammatically a cross-section of a neck of a cathode-ray tube with a layer 124 of a high-ohmic material provided on the inner surface and incorporating a helical structure which constitutes a focusing electrode (focusing lens). A part of the layer 124 without the helical structure is divided into four axial segments 120, 121, 122, 123 each coveting 90 degrees of the circumference and being connected to the focusing electrode via a high resistance. If a focusing signal is applied to a connection point of the layer, the segment system 121, 122, 123, 124 produces an electrostatic four-pole spot shaping field.

Figure 11A:
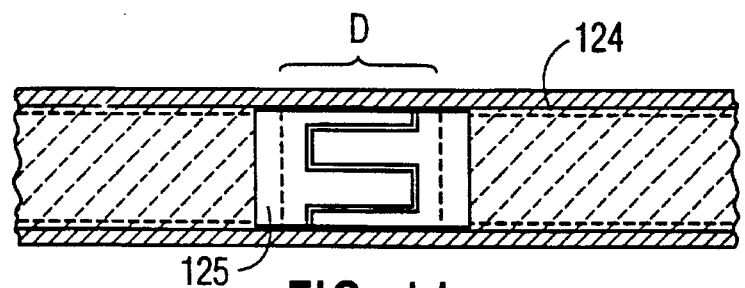

FIG. 11a shows an alternative construction for producing an electrostatic four-pole field in a tube neck. In this case the high-ohmic layer is interrupted over a given length D (of, for example 5 mm). A cube-shaped metal electrode 125 consisting of two parts, whose ends overlap the high-ohmic layer 124, is arranged within the tube neck. The facing pans of the electrode 125 have a finger-shaped (or: square-shaped) structure so that four fingers are located on the circumference in diametrically opposite positions.

Figure 11B:
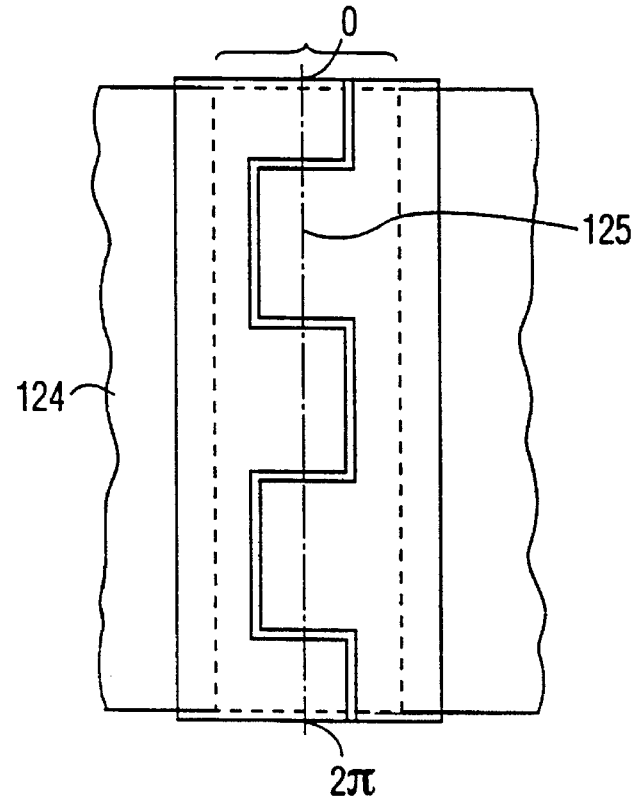

FIG. 11b shows a larger detail of the structure of FIG. 11a generating the four-pole field.

Figure 12A:
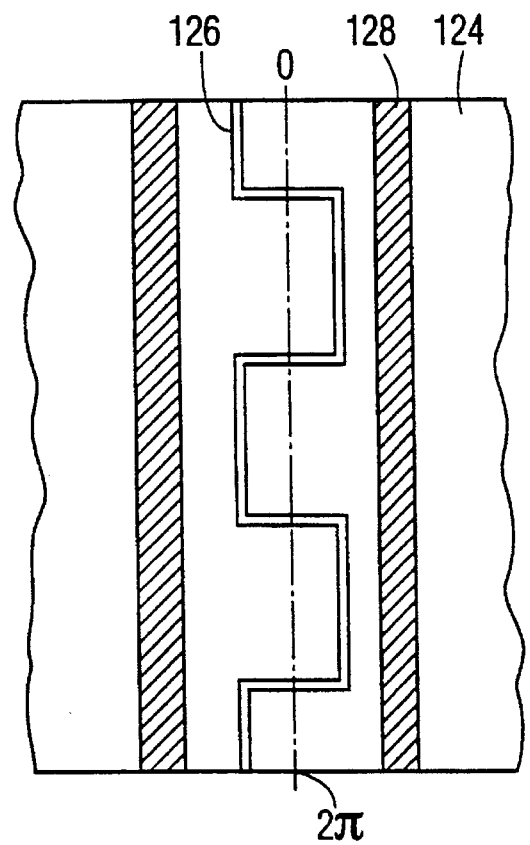

FIG. 12a shows a larger detail of an alternative structure generating a four-pole field. In this case the high-ohmic layer 124 is structured in such a way (for example, by providing a scratch 126) that the layer 124 itself has the desired finger structure.

Figure 12B:
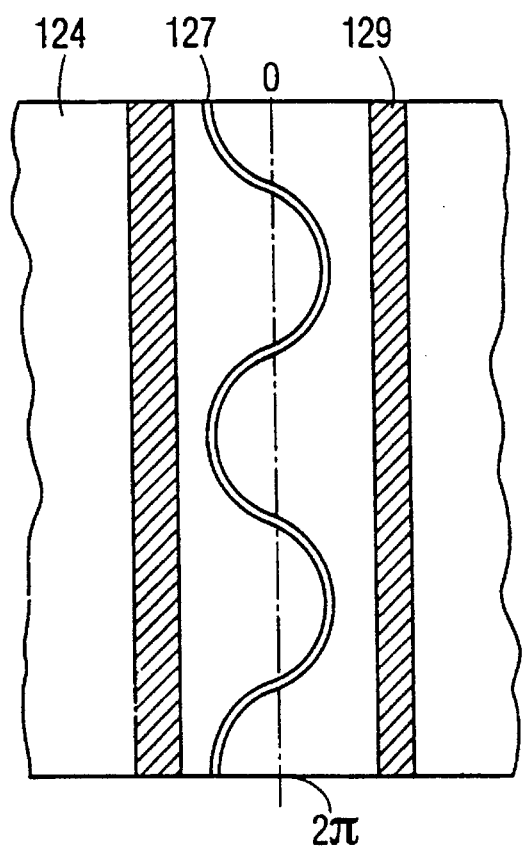

FIG. 12b shows a larger detail of a further structure generating a four-pole field. In this case the high-ohmic layer 124 is provided with a "wavy" scratch 127 instead of a square-shaped scratch with right angles so as to obtain the finger structure. Such a scratch can be provided more easily. The variation of the scratch 127 may satisfy, for example, a $\sin 2\phi$ function.

In the latter cases the structure generating a four-pole field may be combined with low-ohmic electrodes such as (clamping) strips 128, 129 for DC supply of a dynamic focusing signal. In the case of FIG. 11a the dynamic focusing signal may be directly applied to one of the parts of the electrode 125. In the case of FIG. 10 a metal electrode 130 having a segmented structure corresponding to the structure in the high-ohmic layer 124 may be provided on the outer surface of the tube neck. These segments may be connected to a tubular part to which the dynamic focusing signal is applied. This signal is coupled capacitively into the high-ohmic layer 124.

We claim:

1. An electron-optical device comprising:
   a. an envelope containing a target for impingement by electrons and an electron source for producing an electron beam directed toward the target and including a cylindrical portion disposed between the target and the electron source;
   b. a multi-element electrode structure disposed on an inner surface of a first part of the cylindrical portion for producing an electrostatic lens for focusing the electron beam at the target;
   c. scanning means disposed on a second part of the cylindrical portion having an outer surface with a maximum diameter of 15 mm and an inner surface with a substantially smaller diameter, said scanning means producing a field for scanning the electron beam across the target in response to a scanning signal having a frequency which is substantially larger than 16 kHz.

2. An electron-optical device as in claim 1 where the diameter of the outer surface is between 6 and 15 mm.

3. An electron-optical device as in claim 1 where the scanning means produces said field in response to a scanning signal having a frequency which is at least equal to 25 kHz.

4. An electron-optical device as in claim 1 where the target comprises a luminescent display screen.

5. An electron-optical device as in claim 1 where the target comprises a laser crystal which is pumped by said scanning of the electron beam across a surface of the crystal.

6. An electron-optical device as in claim 5 where the target comprises a plurality of adjacent crystal surfaces across which the electron beam is scanned.

7. An electron-optical device as in claim 5 where the multi-element electrode structure includes means for producing an electrostatic four-pole field for transversely elongating the electron beam.

8. A cathode ray tube display device comprising:
   a. an envelope having a display window supporting a luminescent screen, having a cylindrical portion containing an electron source for producing an electron beam directed toward the screen, and having a funnel-shaped portion disposed between the display window and the cylindrical portion;
   b. a multi-element electrode structure disposed on an inner surface of a first part of the cylindrical portion for producing an electrostatic lens for focusing the electron beam at the target; and
   c. scanning means disposed on a second part of the cylindrical portion adjacent the funnel-shaped portion, said second part having an outer surface with a maximum diameter of 15 mm and an inner surface with a substantially smaller diameter, said scanning means producing a field for scanning the electron beam across the target in response to a scanning signal having a frequency which is substantially larger than 16 kHz.

9. A display device as in claim 8 where the diameter of the outer surface is between 6 and 15 mm.

10. A display device as in claim 8 where the scanning means produces said field in response to a scanning signal having a frequency which is at least equal to 25 kHz.

11. A display device as in claim 8 where the scanning means is electrically connected to a deflection signal generator for supplying said scanning signal.

12. A display device as in claim 8 where the second part of the cylindrical portion has an approximate wall thickness of from 1 to 3 mm.

13. A display device as in claim 8 where the scanning means comprises a deflection coil system.

* * * * *